(12) United States Patent
Takahashi (10) Patent No.: US 10,826,486 B2
(45) Date of Patent: Nov. 3, 2020

(54) SWITCHING DRIVING CIRCUIT, SWITCHING CIRCUIT, AND POWER SUPPLY DEVICE

(71) Applicant: Rohm Co., Ltd., Kyoto (JP)

(72) Inventor: Shuntaro Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 317 days.

(21) Appl. No.: 15/768,658

(22) PCT Filed: Sep. 26, 2016

(86) PCT No.: PCT/JP2016/078270
§ 371 (c)(1),
(2) Date: Apr. 16, 2018

(87) PCT Pub. No.: WO2017/073215
PCT Pub. Date: May 4, 2017

(65) Prior Publication Data
US 2018/0302083 A1    Oct. 18, 2018

(30) Foreign Application Priority Data

Oct. 27, 2015  (JP) .................................. 2015-211069

(51) Int. Cl.
*H03K 17/687* (2006.01)
*H03K 17/14* (2006.01)
(Continued)

(52) U.S. Cl.
CPC ............ *H03K 17/687* (2013.01); *H02M 1/08* (2013.01); *H03K 17/145* (2013.01); *B60R 16/03* (2013.01); *H03K 2217/0072* (2013.01)

(58) Field of Classification Search
CPC .................................................. H03K 17/687
See application file for complete search history.

(56) References Cited

U.S. PATENT DOCUMENTS 5,543,739 A    8/1996  Bontempo et al.
5,841,297 A    11/1998 Bayer et al.
(Continued)

FOREIGN PATENT DOCUMENTS

JP    S57-052230 A    3/1982
JP    H6-350425 A    12/1994
(Continued)

OTHER PUBLICATIONS

Japan Patent Office, International Search Report for PCT/JP2016/078270 dated Dec. 13, 2016 (with English translation).

*Primary Examiner* — Daniel Kessie
(74) *Attorney, Agent, or Firm* — Fish & Richardson P.C.

(57) ABSTRACT

This switch drive circuit drives a switch element. The switch drive circuit is provided with a signal input terminal, a disconnect circuit and a connect circuit. A control signal is input into the signal input terminal. The disconnect circuit includes a first switch which switches connection/disconnection of a line connecting the signal input terminal to a control terminal of the switch element, and when the switch element is to be turned off, the disconnect circuit performs a disconnection operation to disconnect the line using the first switch. The connect circuit includes a second switch which switches connection/disconnection between a certain point on the line, positioned on the control terminal side of the first switch, and a reference potential point, and when the switch element is to be turned off, the connect circuit performs a connection operation to connect the certain point to the reference potential point using the second switch.

6 Claims, 6 Drawing Sheets

(51) Int. Cl.
*H02M 1/08* (2006.01)
*B60R 16/03* (2006.01)

(56) References Cited

U.S. PATENT DOCUMENTS

| | | | | |
|---|---|---|---|---|
| 2006/0109034 A1* | 5/2006 | Okitsu | ............... | H03K 17/687 327/108 |
| 2013/0307589 A1* | 11/2013 | Danklefsen | ...... | H03K 19/00361 327/108 |

FOREIGN PATENT DOCUMENTS

| JP | H8-338350 A | 12/1996 |
|---|---|---|
| JP | H9-186568 A | 7/1997 |
| JP | 2003-049755 A | 2/2003 |
| JP | 2006-238547 A | 9/2006 |
| JP | 2013-251460 A | 12/2013 |

* cited by examiner

SWITCHING DRIVING CIRCUIT, SWITCHING CIRCUIT, AND POWER SUPPLY DEVICE

TECHNICAL FIELD

The present invention relates to a switching driving circuit for driving a switching device, a switching circuit, and a power supply device.

BACKGROUND ART

Conventionally, switching driving circuits for driving a low-side switch for use in IPDs (intelligent power devices) are widely used. Typically used as a low-side switch is a switching device such as a MOSFET (metal-oxide-semiconductor field-effect transistor).

Figure 8:
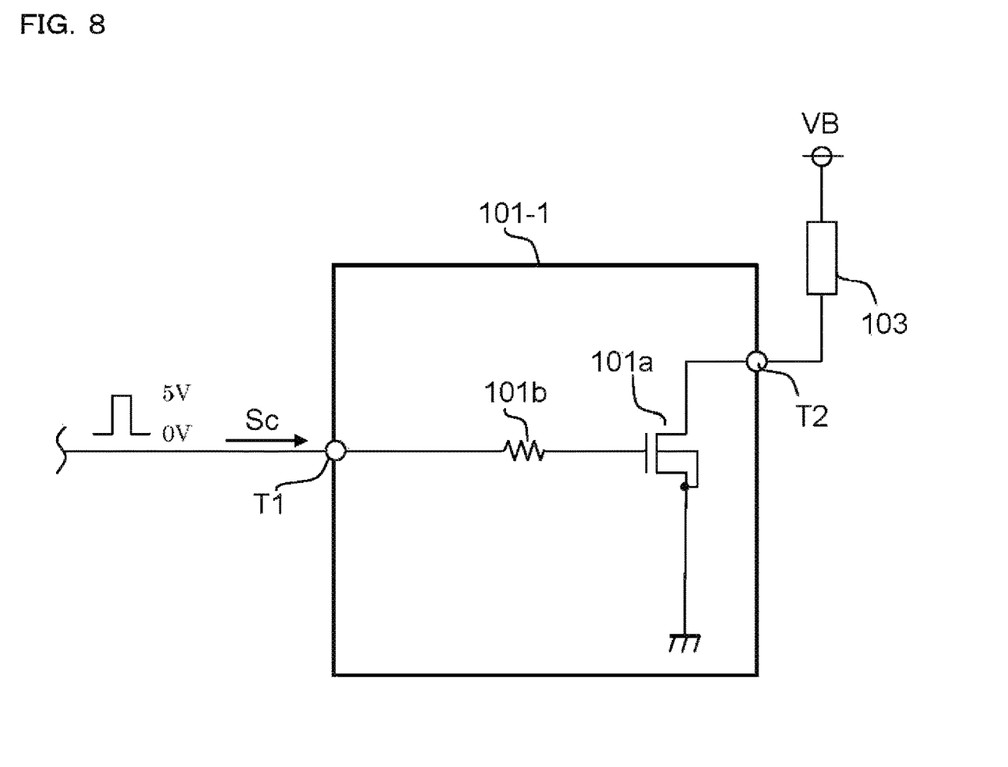
FIG. 8 is a diagram illustrative of a conventional switching circuit.

FIG. 8 shows an example of the configuration of a switching circuit including a switching driving circuit and a switching device as mentioned above. The switching circuit 101-1 configured as shown in FIG. 8 includes a switching device 101a (N-channel MOSFET) used as a low-side switch, a resistor 101b, and terminals (T1, T2). In the switching circuit 101-1, of the switching device 101a, the gate is connected via the resistor 101b to the terminal T1, the drain is connected to the terminal T2, and the source is grounded. Between a power source VB and the terminal T2, a load 103 is provided.

The switching circuit 101-1 is used in a configuration where, as a control signal Sc used to control the switching device 101a, for example, a 5 V/0 V signal (a signal that alternates between a 5 V state, indicating on, and a 0 V state, indicating off) is fed to the terminal T1. In this way, the turning-on and -off of the switching device 101a can be controlled properly.

Specifically, when the control signal Sc shifts from 0 V to 5 V, charging proceeds from the terminal T1 to the input capacitance of the switching device 101a, and the turning-on of the switching device 101a is accomplished. On the other hand, when the control signal Sc shifts from 5 V to 0 V, discharging proceeds from the input capacitance of the switching device 101a to the terminal T1, and turning-off of the switching device 101a is accomplished. Here, the through rate of the on/off switching of the switching device 101a can previously be adjusted through the adjustment of the resistance value of the resistor 101b.

However, with the switching circuit 101-1, when, as the control signal Sc, for example, a 5V/open signal (a signal that alternates between a 5 V state, indicating on, and an open state, indicating off) is used, when the control signal Sc shifts from 5 V to open, discharging from the input capacitance of the switching device 101a does not proceed properly. Thus, the on/off switching of the switching device 101a cannot be performed properly.

Figure 9:
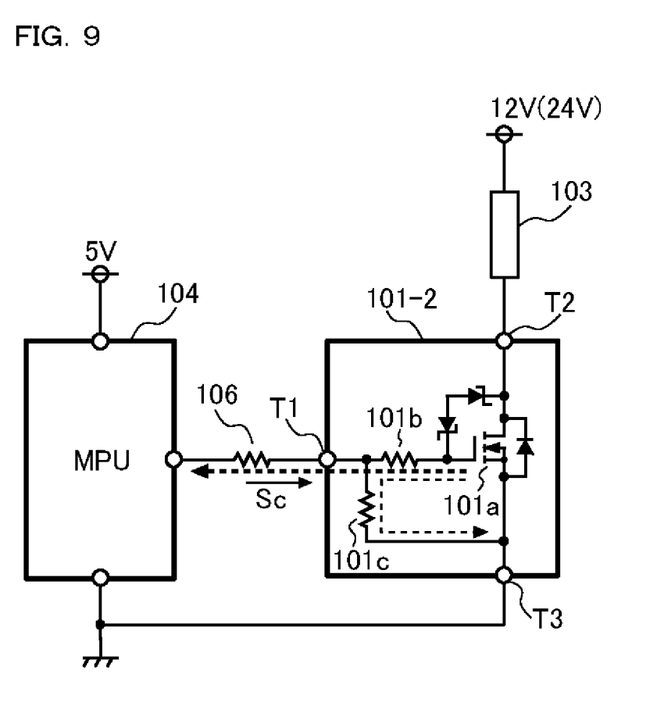
FIG. 9 is a diagram illustrative of a switching circuit disclosed in Patent Document 1.

On the other hand, a switching circuit that is compatible even with such a control signal Sc is disclosed, for example, in Patent Document 1 identified below. FIG. 9 shows the configuration of the switching circuit disclosed in Patent Document 1. In the switching circuit 101-2 configured as shown in FIG. 9, the terminal T1 is grounded via a resistor 101c (pull-down resistor) and a terminal T3.

In a case where a 5 V/0 V control signal Sc is fed from an MPU 104 and is used, the switching circuit 101-2 operates such that, when the control signal Sc shifts from the 5 V to 0 V, discharging from the input capacitance of the switching device 101a proceeds chiefly via a path indicated by a thick broken-line arrow in FIG. 9 (a path not across the resistor 101c). By contrast, in a case where a 5 V/open control signal Sc is fed from an MPU 104 and is used, the switching circuit 101-2 operates such that, when the control signal Sc shifts from the 5 V to open, discharging from the input capacitance of the switching device 101a proceeds chiefly via a path indicated by a fine broken-line arrow in FIG. 9 (a path across the resistor 101c).

Thus, with the switching circuit 101-2, irrespective of whether a 5 V/0 V control signal Sc or a 5V/open control signal Sc is used, discharging from the input capacitance of the switching device 101a is possible, and the turning-off of the switching device 101a is accomplished.

LIST OF CITATIONS

Patent Literature

Patent Document 1: Japanese Patent Application published as No. 2013-251460 (FIG. 1)
Patent Document 2: Japanese Patent Application published as No. 9-186568
Patent Document 3: Japanese Patent Application published as No. 6-350425

SUMMARY OF THE INVENTION

Technical Problem

With the switching circuit 101-2 mentioned above, irrespective of whether a control signal Sc of a 5 V/0 V type or a 5V/open type is used, the switching of the switching device 101a between on and off can be controlled. In this aspect, it can be said that the switching circuit 101-2 is more versatile than the switching circuit 101-1.

However, in a case where a 5 V/0 V control signal Sc is used, the through rate of the switching device 101a when it is turned off depends on the resistors 101b and 106; by contrast, in a case where a 5 V/open control signal Sc is used, the through rate depends on the resistors 101b and 101c.

Due to this difference, the switching circuit 101-2 exhibits a comparatively large difference in the turn-off time of the switching device 101a according to which type of control signal Sc is used. A large difference in the turn-off time due to a difference in the type of the control signal Sc makes it difficult to drive the switching device 101a accurately.

In view of the problems discussed above, an object of the present invention is to provide a switching driving circuit that can drive a switching device accurately irrespective of the type of the control signal, and to provide a switching circuit, a power supply device, and a vehicle that employ such a switching driving circuit.

Means for Solving the Problem

According to one aspect of the present invention, a switching driving circuit for driving a switching device that is switched between on and off according to a voltage fed to a control terminal thereof is configured to include: a signal input terminal to which a control signal used to control the switching is fed; a cut-off circuit including a first switch which switches a line connecting the signal input terminal to the control terminal between a conducting state and a cut-off state, the cut-off circuit performing, when the switching device is turned off, a cutting-off operation to cut off the line by using the first switch; and a conducting circuit including a second switch which switches a path between a predetermined point on the line located on the control terminal side of the first switch and a reference potential point between a conducting state and a cut-off state, the conducting circuit performing, when the switching device is turned off, a conducting operation to make the predetermined point conduct to the reference potential point by using the second switch when the switching device is turned off.

With this configuration, it is possible to drive the switching device accurately irrespective of the type of the control signal.

In the above configuration, more specifically, the connection point between the signal input terminal and the first switch may be connected via a first resistor to the reference potential point, and the cut-off circuit may perform the cutting-off operation when the voltage value at the signal input terminal becomes equal to or lower than a predetermined value.

In the above configuration, more specifically, the first resistor may be configured to divide the voltage at the signal input terminal, and the cut-off circuit may control the first switch based on the result of comparison of the value of the divided voltage and a reference value. With this configuration, it is possible to perform the cutting-off operation easily.

In the above configuration, more specifically, a second resistor may be provided between the first switch and the predetermined point. With this configuration, it is possible to use the second resistor, for example, for the adjustment of the through rate of the switching device.

In the above configuration, more specifically, the connection point between the first switch and the second resistor may be connected via a third resistor to the reference potential point. In the above configuration, more specifically, the conducting circuit may perform the conducting operation such that the predetermined point conducts to the reference potential point via a fourth resistor.

According to another aspect of the present invention, a switching circuit is configured to include the switching driving circuit configured as described above and the switching device used as a low-side switch. In this configuration, specifically, the switching device may be a MOSFET of which the gate is the control terminal.

According to yet another aspect of the present invention, a power supply device is configured to include a power source and the switching circuit configured as described above and to supply electric power to a load provided between the power source and the switching device. According to a further aspect of the present invention, a vehicle is configured to include the power supply device configured as described above and a controller which feeds the control signal to the signal input terminal.

Advantageous Effects of the Invention

A switching driving circuit according to the present invention makes it easy to drive a switching device accurately irrespective of the type of the control signal. With a switching circuit, a power supply device, and a vehicle according to the present invention, it is possible to make the most of the benefits of a switching driving circuit according to the present invention.

DESCRIPTION OF EMBODIMENTS

An embodiment of the present invention will be described below with reference to the accompanying drawings.

[Configuration of a Switching Circuit Etc.]

Figure 1:
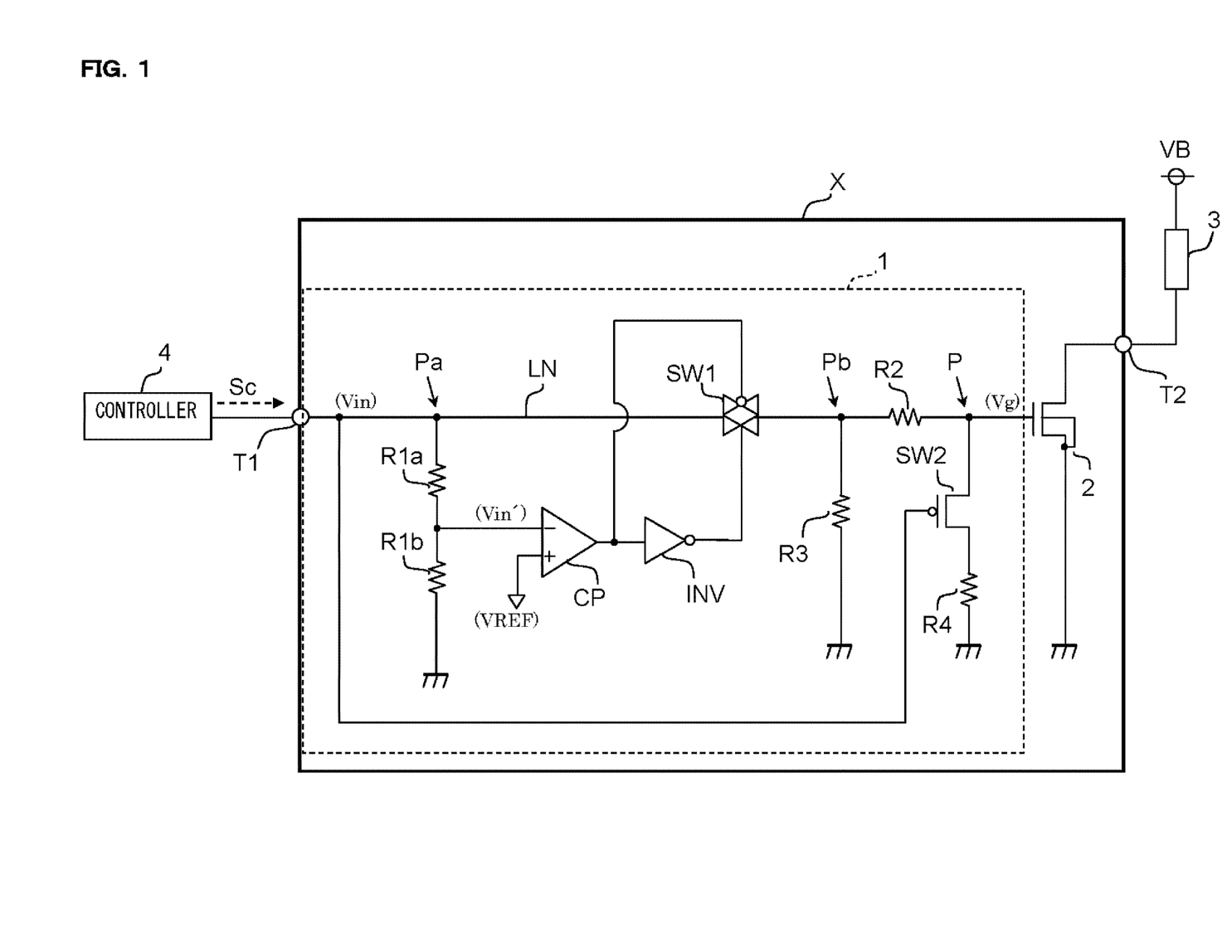
FIG. 1 is a schematic configuration diagram of and around a switching circuit according to one embodiment of the present invention.

FIG. 1 is a configuration diagram of and around a switching circuit X according to the embodiment. As shown there, the switching circuit X includes a switching driving circuit 1, a switching device 2, and terminals (T1, T2) used for connection with the outside. The switching circuit X can be implemented, for example, as a semiconductor device that has its components integrated into a package.

The switching driving circuit 1 is a circuit that drives, according to a control signal Sc fed to it, the switching device 2. The switching device 2 is a switching device that is used as a low-side switch, and is in the embodiment assumed to be, as an example, an N-channel power MOSFET. The drain of the switching device 2 is connected to the terminal T2, and the source of the switching device 2 is connected to a grounded point (which is one form of a reference potential point and is fixed at 0 V).

To the terminal T1 (signal input terminal), a controller 4 is connected. The controller 4 is a functional block that generates the control signal Sc, which is used to control the on/off switching of the switching device 2, and outputs the control signal Sc to the switching driving circuit 1, thereby to control the on/off switching of the switching device 2. For example, in a case where the switching circuit X is for mounting on vehicles, the controller 4 can be an ECU (electronic control unit) that is mounted on a vehicle.

The switching driving circuit 1 may instead have, as the control signal Sc, a 5 V/0 V signal (a signal that alternates between a 5 V state, indicating on, and a 0 V state, indicating off) fed to the terminal T1, or have a 5V/open signal (a signal that alternates between a 5 V state, indicating on, and an open state, indicating off) fed to the terminal T1.

Figure 2:
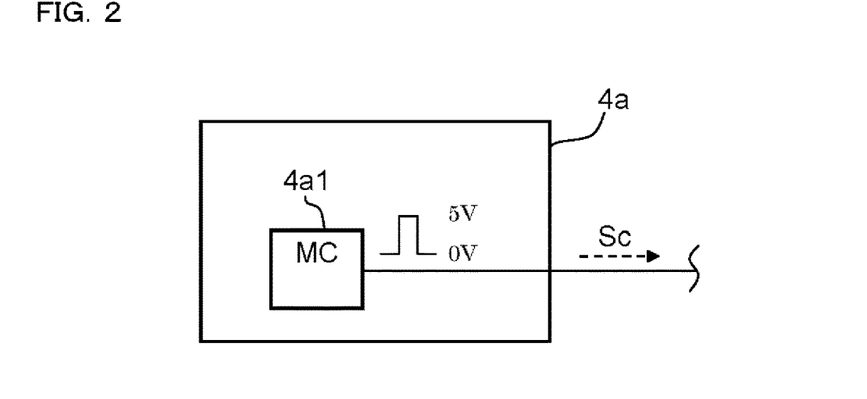
FIG. 2 is a diagram illustrative of a controller that outputs a 5 V/0 V control signal.
Figure 3:
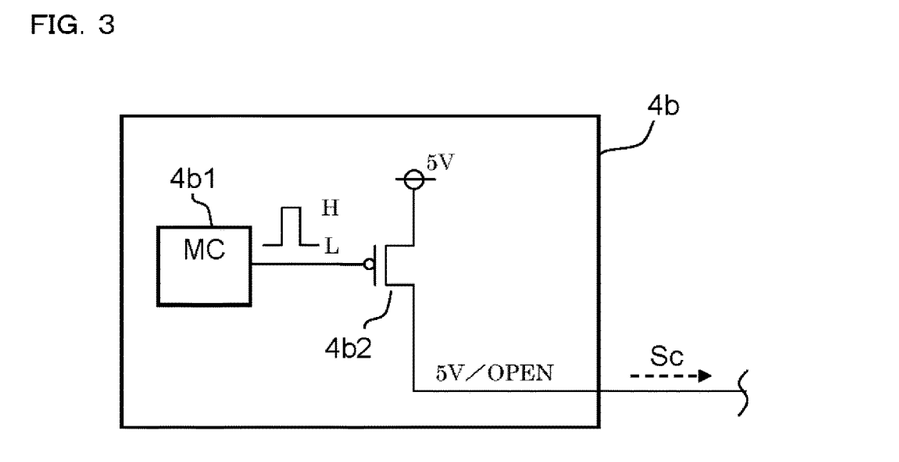
FIG. 3 is a diagram illustrative of a controller that outputs a 5 V/open control signal.

Specifically, the switching driving circuit 1 is compatible with, as the controller 4, both a type as exemplified in FIG. 2 (referred to as the "controller 4a") and a type as exemplified in FIG. 3 (referred to as the "controller 4b"). Of these, whichever is desired can be adopted as the controller 4 according to, for example, the specifications or use of a given product.

The controller 4a is configured to include a microprocessor 4a1 that outputs a 5 V/0 V pulse signal, and this pulse signal is taken as the control signal Sc. In a case where the controller 4a is connected to the terminal T1, a 5 V/0 V control signal Sc is fed to the switching driving circuit 1.

The controller 4b includes a microprocessor 4b1 that outputs a H (high) level/L (low) level pulse signal and a P-channel MOSFET 4b2 (fed at its gate with the pulse signal and connected at its source to a 5 V power source), and is configured to output the control signal Sc from the drain of MOSFET 4b2. In a case where the controller 4b is connected to the terminal T1, a 5 V/open control signal Sc is fed to the switching driving circuit 1.

It should be noted that "5 V" and "0 V" above are merely examples of the specific values of the control signal Sc, and may be set at any other values according to the specifications of the switching circuit X and the like. The MOSFET 4b2 can be replaced with a PNP-type transistor or the like.

Back in FIG. 1, to the terminal T2, a power source VB is connected via a load 3. That is, the load 3 is provided between the power source VB and the switching device 2, and is fed with electric power from the power source VB. When the switching device 2 is on, a current passes from the load 3 via the terminal T2 and the switching device 2 to the grounded point.

The switching driving circuit 1 includes, in addition to the terminal T1, a line LN, resistors (R1a, R1b, and R2 to R4), a first switch SW1, a second switch SW2, a comparator CP, and an inverter INV.

Figure 4:
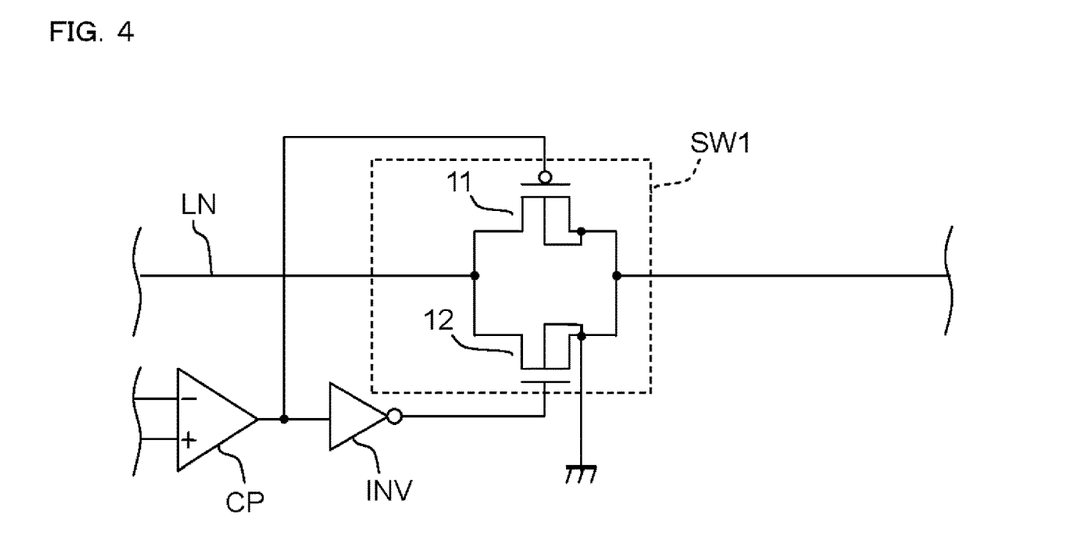
FIG. 4 is a diagram illustrative of a specific configuration of a first switch.

In the embodiment, the first switch SW1 is assumed to be, as one example, an analog switch configured as shown in FIG. 4. That is, in the embodiment, the first switch SW1 is configured as the combination of a P-channel MOSFET 11 and an N-channel MOSFET 12, and switches the line LN between a conducting state and a cut-off state according to the input to the gates of those MOSFETs. In the embodiment, the second switch SW2 is assumed to be, as one example, a P-channel MOSFET.

As shown in FIG. 1, the first switch SW1 is provided in the line LN connecting the terminal T1 to the gate of the switching device 2. A predetermined point P on the line LN located on the switching device 2 side of the first switch SW1 is connected to the source of the second switch SW2. The drain of the second switch SW2 is connected via the resistor R4 to the grounded point.

The connection point Pa between the terminal T1 and the first switch SW1 is grounded via the resistor R1a and the resistor R1b in this order. The connection point between the resistors R1a and R1b is connected to the inverting input terminal of the comparator CP. The non-inverting input terminal of the comparator CP is set to be fed with a reference voltage VREF.

The output terminal of the comparator CP is connected to the gate of the P-channel MOSFET 11 in the first switch SW1, and is also connected via the inverter INV to the gate of the N-channel MOSFET 12 in the first switch SW1.

Between the first switch SW1 and the point P, the resistor R2 is provided. Moreover, the connection point Pb between the first switch SW1 and the resistor R2 is connected via the resistor R3 to the grounded point. The terminal T1 is connected to the gate of the second switch SW2. The terminal T1 may instead be connected via a resistor to the gate of the second switch SW2.

The voltage at the terminal T1 in the switching driving circuit 1 is referred to as the voltage Vin, and the voltage obtained through voltage division of the voltage Vin with the resistors R1a and R1b is referred to as the voltage Vin'. The voltage at the gate of the switching device 2 is referred to as the gate voltage Vg.

[Operation of the Switching Driving Circuit Etc.]

Figure 5:
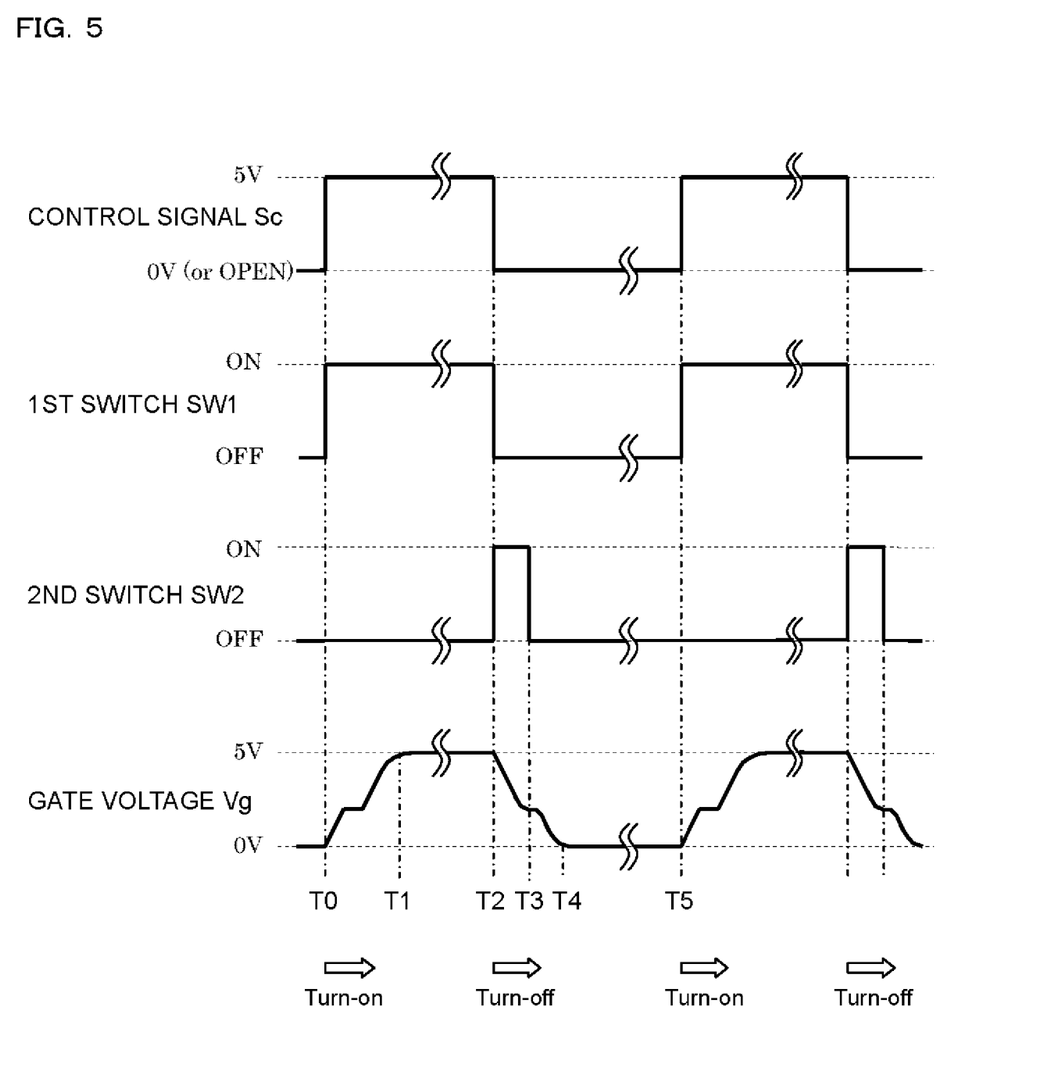
FIG. 5 is a timing chart of relevant states including that of a control signal.

Next, the operation of the switching driving circuit 1 etc. will be described with reference to FIG. 5. FIG. 5 is a timing chart of the states of the control signal Sc, the first switch SW1, the second switch SW2, and the gate voltage Vg.

Immediately before time point T0, the control signal Sc is at 0 V (or is open in a case where the controller 4b is used in place of the controller 4a; the same applies throughout the following description), the first and second switches SW1 and SW2 are both off, and the gate voltage Vg is at 0 V. When, at time point T0, the control signal Sc shifts from 0 V to 5 V, the voltage Vin' exceeds the reference voltage VREF, and the first switch SW1 turns on.

Between time points T0 and T1, charging proceeds from the terminal T1 to the input capacitance of the switching device 2, and the gate voltage Vg rises. In this process, the turning-on of the switching device 2 is accomplished. The through rate in the turning-on depends on the resistance R2.

Thereafter, when, at time point T2, the control signal Sc shifts from the 5 V to 0 V, the voltage Vin' falls below the reference voltage VREF, and the first switch SW1 turns off. Thus, the line LN is cut off, and the voltage Vin drops rapidly. Moreover, as the voltage Vin drops, the second switch SW2 turns on, and the gate of the switching device 2 becomes connected via the resistor R4 to the grounded point.

Figure 6:
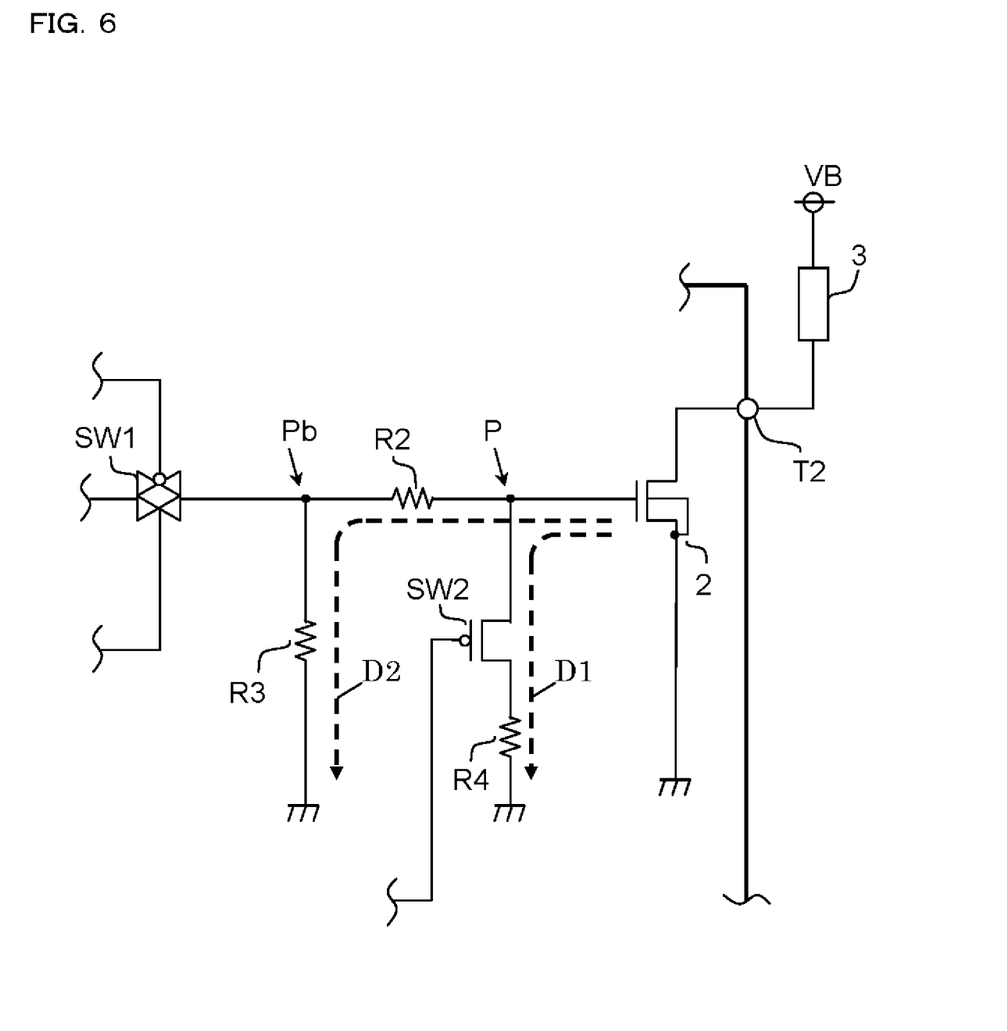
FIG. 6 is a diagram illustrative of a discharge path of gate charge.

Between time points T2 and T3, discharging (the discharging of the gate charge) proceeds from the input capacitance of the switching device 2 via, as shown in FIG. 6, a path D1 (a path across the resistor R4) and a path D2 (a path across the resistors R2 and R3). The availability of not only the path D2 but also the path D1 as the discharge path makes it possible to adjust the speed of the discharging.

When the discharging has proceeded to a certain degree and, at time point T3, the difference between the gate voltage Vg and the voltage Vin (the gate-source voltage of the second switch SW2) becomes lower than a prescribed value, the second switch SW2 turns off. Thereafter, between time points T3 and T4, the path D1 remains cut off, and thus discharging proceeds via the path D2.

In the above-described process starting at time point T2, the turning-off of the switching device 2 is accomplished. The through rate in the turning-off depends on the on resistance of the second switch SW2 and the resistances R2, R3, and R4. Thereafter, at time point T5, the control signal Sc shifts from 0 V to 5 V. From time point T5 on, operation similar to the above-described operation starting at time point T0 is repeated.

Here, in terms of the turn-off time Toff (the time required for the switching device 2 to turn off), in the embodiment, irrespective of whether the control signal Sc used is of the 5 V/0 V type or the 5 V/open type, the turn-off time Toff is approximately equal. In other words, irrespective of whether the controller 4a or the controller 4b is adopted as the controller 4, the turn-off time Toff is approximately equal.

The chief reason is that, with no matter which type of control signal Sc, the discharging of the gate charge proceeds via similar paths (the paths D1 and D2 mentioned above) starting at time point T2, and the through rate in the turning-off is approximately equal. That is, in the embodiment, the variation of the discharge path due to a difference in the type of the control signal Sc is suppressed, and thus the difference in the turn-off time Toff due to that variation is suppressed.

The just-mentioned suppression of the variation of the discharge path is achieved in the following manner: when the switching device 2 is turned off, the line LN is cut off by use of the first switch SW1, and thereby the discharging of the gate charge via the terminal T1 and the resistor R1b is suppressed.

Moreover, in the embodiment, when the switching device 2 is turned off, the point P is made to conduct to the grounded point by use of the second switch SW2, and thereby the discharging of the gate charge is promoted. Thus, even when the line LN is being cut off by the first switch SW1, it is still possible to adjust the turn-off time of the switching device 2.

[Resistors Etc.]

The resistors R1a and R1b (first resistor) provided in the switching driving circuit 1 serve to divide the voltage Vin at the terminal T1. The divided voltage Vin' is fed to the non-inverting input terminal of the comparator CP. Thus, the comparator CP compares the value of the voltage Vin' with the value (reference value) of the reference voltage VREF, and based on the result of the comparison, the first switch SW1 is controlled.

More specifically, when the voltage Vin' is higher than the reference voltage VREF, the first switch SW1 is in a state in which it lets the line LN conduct; when the voltage Vin' is lower than the reference voltage VREF, the first switch SW1 is in a state in which it cuts off the line LN. The resistors R1a and R1b can be used also as resistors for monitoring the input voltage to achieve an UVLO (under-voltage lock-out) function.

The resistor R2 (second resistor) serves, among others, as a chief resistor for the adjustment of the through rate of the switching device 2 (in particular, the through rate during turning-on). The resistance values of the individual resistors including the resistor R2 in the switching driving circuit 1 are set appropriately beforehand such that the through rate has the desired value.

The resistor R3 (third resistor) serves, among others, as a pull-down resistor for coping with situations where the control signal Sc becomes open. Moreover, the path leading from the point Pb via the resistor R3 to the grounded point is used also for the discharging of the gate charge as mentioned above, and functions as a path through which the gate charge is discharged sufficiently even after the second switch SW2 turns off.

The resistor R4 (fourth resistor) has a great influence on the discharging of the gate charge between time points T2 and T3. The resistor R4 can be given a resistance value lower than that of the resistor R3, and can be so arranged as to be connected directly to the gate of the switching device 2 when the second switch SW2 is on. In that case, the through rate of the switching device 2 during turning-on depends chiefly on the resistance value of the resistor R2, and the through rate of the switching device 2 during turning-off depends chiefly on the resistance value of the resistor R4. With this taken into consideration, the resistance values of the resistors in the switching driving circuit 1 can be so set that the through rate of the switching device 2 during turning-on is comparable with that during turning-off.

[Other Features]

As described above, a switching driving circuit 1 is configured to drive a switching device 2 (which is switched between on and off according to a voltage that is fed to its gate). The switching driving circuit 1 includes a terminal T1 to which a control signal Sc used to control the on/off switching of the switching device 2 is fed, and further includes a cut-off circuit and a conducting circuit.

The cut-off circuit is a circuit which includes a first switch SW1 for switching a line LN between a conducting state and a cut-off state and which, when the switching device 2 is turned off, performs a cutting-off operation to cut off the line LN by using the first switch SW1. The conducting circuit is a circuit which includes a second switch SW2 for switching a path between a predetermined point P on the line LN and a grounded point between a conducting state and a cut-off state and which, when the switching device 2 is turned off, makes the predetermined point P conduct to the grounded point by using the second switch SW2.

Thus, with the switching driving circuit 1, even with different types of control signal Sc, the turn-off time Toff remains approximately equal; thus, irrespective of the type of the control signal Sc, it is easy to drive the switching device 2 accurately.

The connection point Pa between the terminal T1 and the first switch SW1 is connected via resistors R1a and R1b to the grounded point, and the cut-off circuit is configured to perform the cutting-off operation when the voltage value Vin at the terminal T1 becomes equal to or lower than a predetermined value.

The resistors R1a and R1b are configured to divide the voltage Vin at the terminal T1, and the cut-off circuit is configured to control the first switch SW1 based on the result of comparison between the value (Vin') of the divided voltage and a reference value (VREF). It is thus possible to perform the cutting-off operation easily.

The switching circuit X includes a switching driving circuit 1 and a switching device 2 which is used as a low-side switch. The switching circuit X configured as shown in FIG. 1 is used as part of a power supply device for supplying electric power to a load 3. The power supply device includes a power source VB and the switching circuit X, and supplies electric power to the load 3 provided between the power source VB and the switching device 2.

Figure 7:
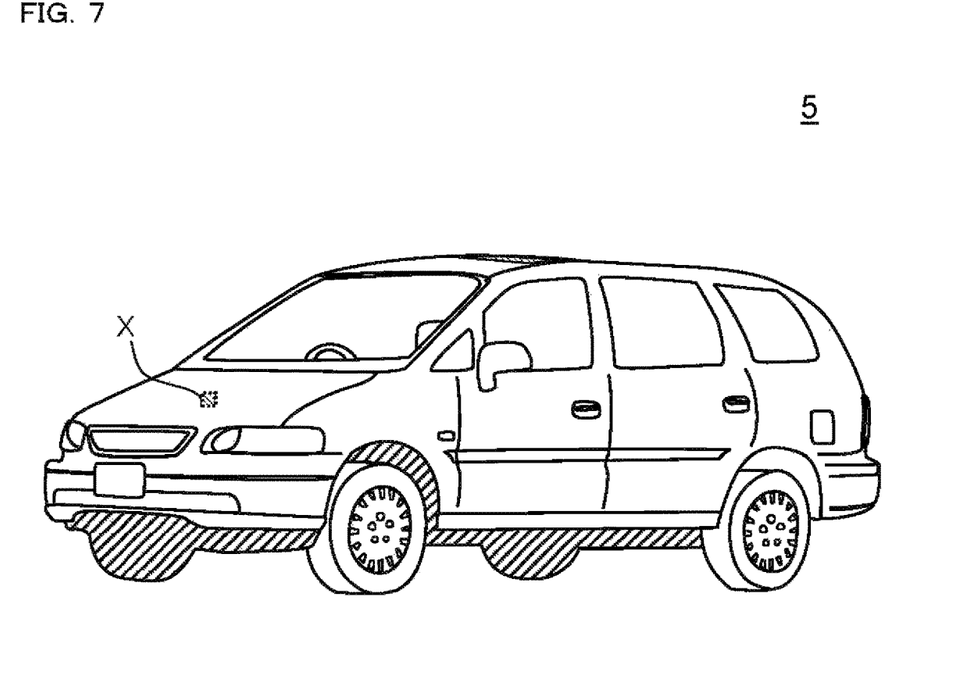
FIG. 7 is an exterior view of an example of a vehicle mounted with a power supply device according to the embodiment.

The switching circuit X can be used as a vehicle-mounted IPD. In that case, the switching circuit X functions as part of a vehicle-mounted power supply device. FIG. 7 is an exterior view of an example of a vehicle mounted with such a power supply device.

As shown there, the switching circuit X is installed at a predetermined position on a vehicle 5 (for example, near the engine room). A battery or the like provided on the vehicle 5 is used as the power source VB, and an ECU or the like mounted on the vehicle 5 functions as the controller 4. Solenoids, lamps, motors, and the like mounted on the vehicle 5 can correspond to the load 3.

The present invention can be implemented with any configuration other than those specifically described above, and allow for many modifications within the spirit of the invention. That is, it should be understood that the embodiment described above is in every aspect illustrative and not restrictive, and that the technical scope of the present invention is defined not by the description of the embodiment given above but by the scope of the appended claims and encompasses any modification in the sense and scope equivalent to those of the claims.

INDUSTRIAL APPLICABILITY

The present invention finds application in, for example, vehicle-mounted power supply devices and the like.

LIST OF REFERENCE SIGNS 1 switching driving circuit
2 switching device
3 load
4 controller
4a controller (of a type outputting a 5 V/0 V control signal)

4a1 microprocessor
4b controller (of a type outputting a 5 V/open control signal)
4b1 microprocessor
4b2 P-channel MOSFET
5 vehicle
11 P-channel MOSFET
12 N-channel MOSFET
CP comparator
INV inverter
LN line
SW1 first switch
SW2 second switch
T1 terminal (signal input terminal)
T2 terminal
VB power source
X switching circuit
R1a, R1b resistor (first resistor)
R2 resistor (second resistor)
R3 resistor (third resistor)
R4 resistor (fourth resistor)

The invention claimed is:

1. A switching driving circuit for driving a switching device that is switched between on and off according to a voltage fed to a control terminal thereof, the switching driving circuit comprising:
    a signal input terminal to which a control signal used to control the switching is fed;
    a cut-off circuit including a first switch which switches a line connecting the signal input terminal to the control terminal between a conducting state and a cut-off state, the cut-off circuit performing, when the switching device is turned off, a cutting-off operation to cut off the line by using the first switch;
    a second switch which switches a path between a predetermined point on the line located on a control terminal side of the first switch and a reference potential point between a conducting state and a cut-off state;
    a first resistor provided between a connection point, which is between the signal input terminal and the first switch, and a reference potential point;
    a second resistor provided on the line so as to be located between the first switch and the predetermined point such that first and second terminals of the second resistor both are present along the line;
    a third resistor provided between a connection point, which is between the first switch and the second resistor, and the reference potential point; and
    a fourth resistor provided between the predetermined point and the reference potential point, wherein the fourth resistor is connected in series to the second switch, wherein
    the cut-off circuit turns off the first switch to start the cutting-off operation when a voltage value at the signal input terminal becomes equal to or lower than a predetermined value,
    when the cut-off circuit starts the cutting-off operation, the second switch turns on and the predetermined point conducts to the reference potential point via the fourth resistor,
    when, after the cutting-off operation is started, discharging by the second resistor, the third resistor, and the fourth resistor proceeds by a predetermined amount, the second switch turns off to switch from the discharging by the second resistor, the third resistor, and the fourth resistor to discharging by the second resistor and the third resistor, and the discharging by the second resistor and the third resistor is performed until a potential at the predetermined point falls to a potential at the reference potential point.

2. The switching driving circuit according to claim 1, wherein
    the first resistor is configured to divide a voltage at the signal input terminal, and
    the cut-off circuit controls the first switch based on a result of comparison of a value of the divided voltage and a reference value.

3. A switching circuit comprising:
    the switching driving circuit according to claim 1; and
    the switching device used as a low-side switch.

4. The switching circuit according to claim 3, wherein the switching device is a MOSFET of which a gate is the control terminal.

5. A power supply device comprising:
    a power source; and
    the switching circuit according to claim 3, wherein
    electric power is supplied to a load provided between the power source and the switching device.

6. A vehicle comprising:
    the power supply device according to claim 5; and
    a controller which feeds the control signal to the signal input terminal.

* * * * *